(12) United States Patent
Yu et al.

(10) Patent No.: US 9,740,072 B2
(45) Date of Patent: Aug. 22, 2017

(54) COLOR FILTER AND LIQUID CRYSTAL PANEL

(71) Applicant: Shenzhen China Star Optoelectronics Technology Co., Ltd., Shenzhen (CN)

(72) Inventors: Xiaoping Yu, Shenzhen (CN); Hsiaohsien Chen, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 222 days.

(21) Appl. No.: 14/777,523

(22) PCT Filed: Jun. 24, 2015

(86) PCT No.: PCT/CN2015/082165
§ 371 (c)(1),
(2) Date: Sep. 16, 2015

(87) PCT Pub. No.: WO2016/197405
PCT Pub. Date: Dec. 15, 2016

(65) Prior Publication Data
US 2017/0168365 A1    Jun. 15, 2017

(30) Foreign Application Priority Data

Jun. 8, 2015 (CN) .......................... 2015 1 0310490

(51) Int. Cl.
*G02F 1/1335* (2006.01)
*G02F 1/15* (2006.01)
(Continued)

(52) U.S. Cl.
CPC ........... *G02F 1/1521* (2013.01); *G02B 5/201* (2013.01); *G02B 5/223* (2013.01);
(Continued)

(58) Field of Classification Search
CPC ....... G03F 7/0007; G02B 5/201; G02B 5/223; G02F 1/133514; G02F 1/133516;
(Continued)

(56) References Cited

U.S. PATENT DOCUMENTS

2006/0012614 A1* 1/2006 Asao ................. G02F 1/133514
345/690
2008/0137168 A1* 6/2008 Abe ................. G02F 1/133514
359/273
(Continued)

FOREIGN PATENT DOCUMENTS

CN    102707510 A    10/2012
CN    103698832 A    4/2014

OTHER PUBLICATIONS

Computer-generated translation of CN 102707510 (Oct. 2012).*

*Primary Examiner* — John A McPherson
(74) *Attorney, Agent, or Firm* — Leong C. Lei

(57) ABSTRACT

The present invention provides a color filter and a liquid crystal display. The color filter comprises a substrate, and a color resist layer and a black matrix positioned on the substrate, and the color resist layer comprises a plurality of pixel areas aligned in array, and the plurality of pixel areas are separated by the black matrix, and the pixel area comprises a sub pixel main area and a sub pixel sub area, and two sides of the sub pixel sub area are respectively provided with a first transparent electrode and a second transparent electrode electrically coupled thereto; the sub pixel sub area is made by electrochromic material, and by adjusting voltage signals applied to the two sides of the sub pixel sub area with the first transparent electrode and the second transparent electrode, color variation of the sub pixel sub area is controlled to achieve switch of the color filter between high color saturation and high brightness display modes. The liquid crystal panel of the present invention is provided with (Continued)

the color filter capable of achieving switch of the color filter between high color saturation and high brightness display modes to satisfy the display requirement of high color saturation and high brightness at the same time.

15 Claims, 2 Drawing Sheets

(51) Int. Cl.
| | | |
|---|---|---|
| *G02F 1/1343* | (2006.01) | |
| *G02F 1/155* | (2006.01) | |
| *G02F 1/163* | (2006.01) | |
| *G02B 5/22* | (2006.01) | |
| *G03F 1/00* | (2012.01) | |
| *G02B 5/20* | (2006.01) | |

(52) U.S. Cl.
CPC .... *G02F 1/13439* (2013.01); *G02F 1/133512* (2013.01); *G02F 1/133514* (2013.01); *G02F 1/133516* (2013.01); *G02F 1/134309* (2013.01); *G02F 1/155* (2013.01); *G02F 1/163* (2013.01); *G03F 1/0007* (2013.01); *G02F 2001/134345* (2013.01); *G02F 2001/1515* (2013.01); *G02F 2201/44* (2013.01)

(58) Field of Classification Search
CPC .......... G02F 1/15; G02F 1/1506; G02F 1/155; G02F 1/157; G02F 1/1521; G02F 2001/1512; G02F 1/1523; G02F 2001/134345; G02F 2201/44; G02F 1/134309; G02F 1/13439
USPC ............................................... 430/7; 349/106
See application file for complete search history.

(56) References Cited

U.S. PATENT DOCUMENTS

| | | | | |
|---|---|---|---|---|
| 2014/0085578 | A1* | 3/2014 | Gu | ................... G02F 1/133514 349/106 |
| 2016/0202522 | A1* | 7/2016 | Lee | ................... G02F 1/133514 349/106 |
| 2017/0139266 | A1* | 5/2017 | Yu | ................... G02F 1/133514 |

* cited by examiner

COLOR FILTER AND LIQUID CRYSTAL PANEL

FIELD OF THE INVENTION

The present invention relates to a display technology field, and more particularly to a color Filter and a liquid crystal panel.

BACKGROUND OF THE INVENTION

The LCD (Liquid Crystal Display) possesses advantages of thin body, power saving and no radiation to be widely used in many application scope. It has been widely utilized in, such as mobile phones, PDAs (personal digital assistance), digital cameras, laptop screens or notebook screens.

The present thin film transistor liquid crystal display comprises a shell, a LCD panel located in the shell and a backlight module located in the shell. Particularly, the structure of the LCD panel mainly comprise a TFT Array Substrate (Thin Film Transistor Array Substrate), a CF (Color Filter) and a Liquid Crystal Layer. The working principle is that the light of backlight module is reflected to generate images by applying driving voltages to the two glass substrate for controlling the rotations of the liquid crystal molecules. The liquid crystal display mainly uses the color filter to show color images. The performance of the color filter directly affects the abilities of the color saturation, color contrast ratio, display brightness.

Please refer to FIG. 1, which is a top view diagram of a color filter according to prior art. The color filter comprises a substrate 100, and a color resist layer 200 and a black matrix 400 positioned on the substrate 100, and the color resist layer 200 comprises a plurality of color resist blocks 300 aligned in array. The color resist block 300 can be a red color resist block (R), a green resist block (G) or a blue resist block (B). The plurality of color resist blocks 300 are separated with the black matrix 400, and all the color resist blocks 300 utilize strip structure design. Each color resist block 300 corresponds to one sub pixel in the liquid crystal display. The color coordinate settings of the pixels of different colors can reflect the color expression capability of the liquid crystal display. The expressed colors of the pixels of different colors applied with the voltage will be restricted by the color expression capability of the color resist. For raising the color expression capability of the color resist, the visible light transmission of the pixel of the color may has loss, and thus, the entire display brightness of the liquid crystal display is decreased. At present, a method of adding white (W) matrix or yellow (Y) matrix to obtain RGBW or RGBY display matrix is proposed to achieve high brightness or high color saturation display modes. However, as increasing the color saturation, the display brightness of the display will be decreased. The requirement of the high color saturation and the high brightness cannot be satisfied at the same time.

The electrochromism means that the material occurs stable and reversible phenomenon in an electric field. When the material occurs the injection and extraction of the electrons and ions under the action of electrochemistry, the valence state and the chemical composition will be changed. Thus, the reflection and transmission capabilities of the material are changed. In the appearance and performance, it shows the reversible variation of the color and the transparency. The main properties are: (1), the injection and extraction of the charges in the electrochromic material can be conveniently realized with the variation of the external voltage or current. the volume of the injection or extraction charge determines the coloring degree; (2) coloring or non-coloring can be conveniently realized by changing the polarity of the voltage; (3) the colored material can keep in the colored state and have memory function in the condition that the current is cut and no oxydoreduction reaction occurs. Based on the aforesaid properties, the electrochromic material has been gradually employed to manufacture the display device.

SUMMARY OF THE INVENTION

An objective of the present invention is to provide a color filter, capable of switching between high color saturation and high brightness display modes.

Another objective of the present invention is to provide a liquid crystal panel, capable of switching between high color saturation and high brightness display modes.

For realizing the aforesaid objectives, the present invention provides a color filter, comprising a substrate, and a color resist layer and a black matrix positioned on the substrate, and the color resist layer comprises a plurality of pixel areas aligned in array, and the plurality of pixel areas are separated by the black matrix, and the pixel area comprises a sub pixel main area and a sub pixel sub area, and two sides of the sub pixel sub area are respectively provided with a first transparent electrode and a second transparent electrode electrically coupled thereto;

the sub pixel sub area is made by electrochromic material, and by adjusting voltage signals applied to the two sides of the sub pixel sub area with the first transparent electrode and the second transparent electrode, color variation of the sub pixel sub area is controlled to achieve switch of the color filter between high color saturation and high brightness display modes.

The electrochromic material is at least one of n-type metal oxide and cathodic decolorization conducting polymer.

The cathodic decolorization conducting polymer is compound based on viologen group, compound based on phthalate, compound based on pyridine or compound based on anthraquinone.

The electrochromic material is at least one of p-type metal oxide and anodic decolorization conducting polymer.

The anodic decolorization conducting polymer is compound based on aniline, compound based on amino quinones, organic compound based on rare earth elements or compound based on dibenzo-p-dioxins.

The sub pixel sub area is made by vacuum sputter deposition, chemical polymerization or electrochemical polymerization.

Material of the sub pixel main area is a mixture of dye and photoresist; a manufacture method of the sub pixel main area is: dispersing the dye in the photoresist to manufacture a photoresist mixture with color, and coating the photoresist mixture with color on the substrate, and then performing photolithography processes of exposure and development.

The sub pixel sub area shows another specific color different from the sub pixel main area in condition of not being applied with the voltage signal, and appears to be transparent and shows no color in condition of being applied with the voltage signal.

The sub pixel sub area appears to be transparent and shows no color in condition of not being applied with the voltage signal, and shows another specific color different from the sub pixel main area in condition of being applied with the voltage signal.

The present invention further provides a color filter, comprising a substrate, and a color resist layer and a black matrix positioned on the substrate, and the color resist layer comprises a plurality of pixel areas aligned in array, and the plurality of pixel areas are separated by the black matrix, and the pixel area comprises a sub pixel main area and a sub pixel sub area, and two sides of the sub pixel sub area are respectively provided with a first transparent electrode and a second transparent electrode electrically coupled thereto;

the sub pixel sub area is made by electrochromic material, and by adjusting voltage signals applied to the two sides of the sub pixel sub area with the first transparent electrode and the second transparent electrode, color variation of the sub pixel sub area is controlled to achieve switch of the color filter between high color saturation and high brightness display modes;

wherein the sub pixel sub area is made by vacuum sputter deposition, chemical polymerization or electrochemical polymerization;

wherein material of the sub pixel main area is a mixture of dye and photoresist; a manufacture method of the sub pixel main area is: dispersing the dye in the photoresist to manufacture a photoresist mixture with color, and coating the photoresist mixture with color on the substrate, and then performing photolithography processes of exposure and development;

wherein the sub pixel sub area shows another specific color different from the sub pixel main area in condition of not being applied with the voltage signal, and appears to be transparent and shows no color in condition of being applied with the voltage signal.

The present invention further provides a liquid crystal panel, comprising the aforesaid color filter.

The benefits of the present invention are: the present invention provides a color filter, comprising a substrate, and a color resist layer and a black matrix positioned on the substrate, and the color resist layer comprises a plurality of pixel areas aligned in array, and the plurality of pixel areas are separated by the black matrix, and the pixel area comprises a sub pixel main area and a sub pixel sub area, and two sides of the sub pixel sub area are respectively provided with a first transparent electrode and a second transparent electrode. The sub pixel sub area is made by electrochromic material, and by adjusting voltage signals applied to the two sides of the sub pixel sub area with the first transparent electrode and the second transparent electrode, the color variation of the sub pixel sub area is controlled to change the visible light transmission and the color expression of the sub pixel sub area to achieve switch of the color filter between high color saturation and high brightness display modes. Except satisfying the requirement of display requirement of high color saturation and high brightness at the same time, the color filter of the present invention further possesses advantages of high contrast, wide view angle and rich colors. The liquid crystal panel of the present invention is provided with the color filter capable of achieving switch of the color filter between high color saturation and high brightness display modes to satisfy the display requirement of high color saturation and high brightness at the same time.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
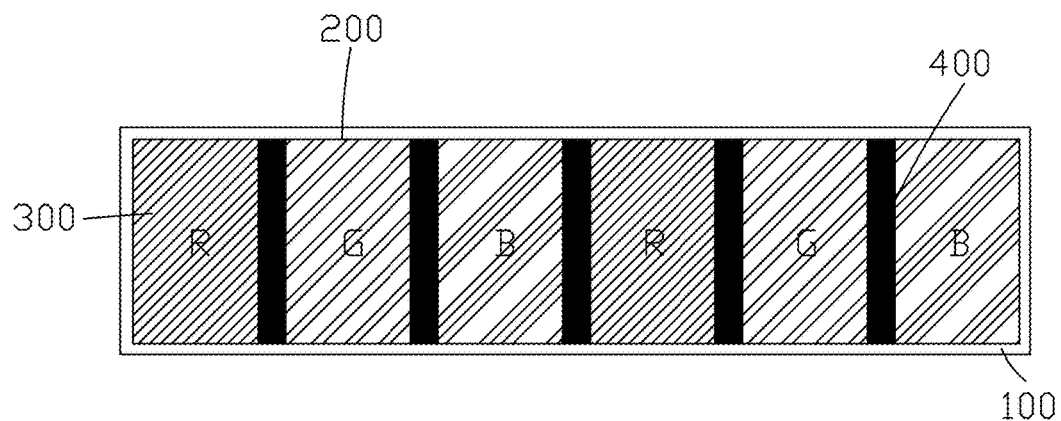
FIG. 1 is a top view diagram of a color filter according to prior art.
Figure 2:
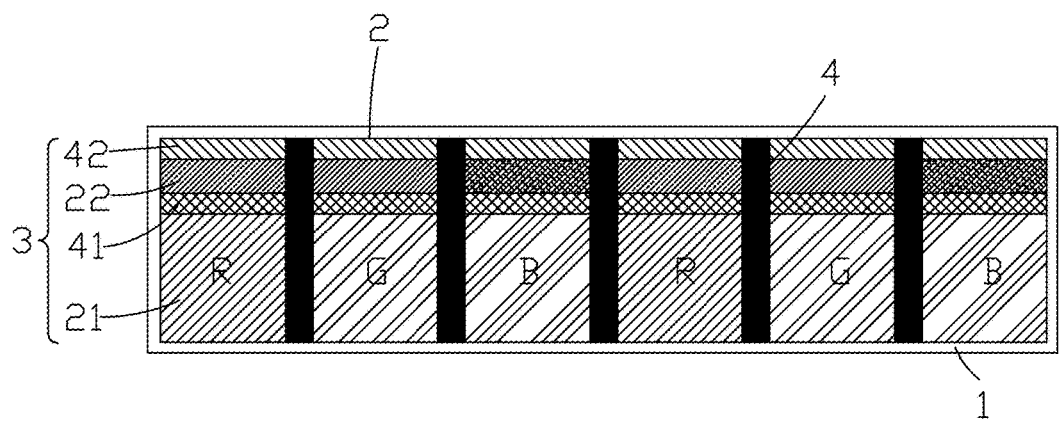
FIG. 2 is a top view diagram of a color filter in high color saturation display mode according to the present invention.
Figure 4:
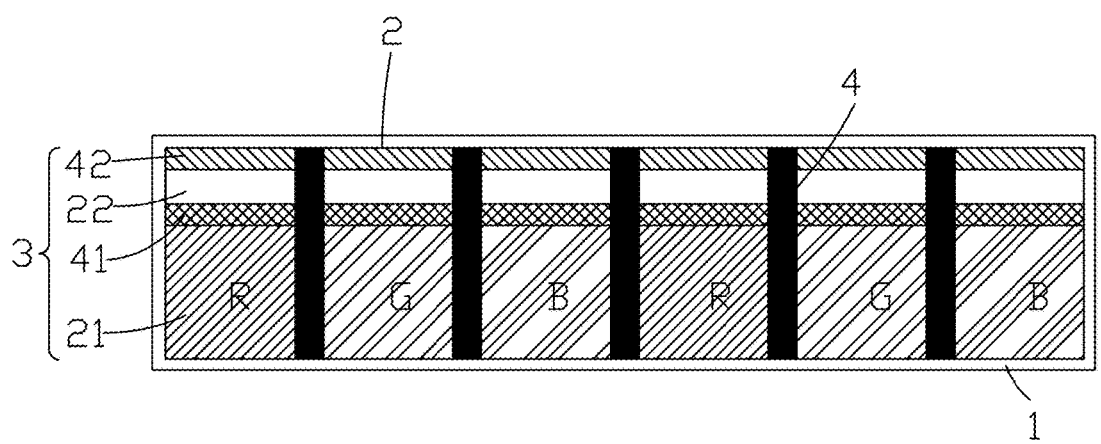
FIG. 4 is a top view diagram of a color filter in high brightness display mode according to the present invention.

Please refer to FIG. 2 and FIG. 4. The present invention first provides a color filter, comprising a substrate 1, and a color resist layer 2 and a black matrix 4 positioned on the substrate 1, and the color resist layer 2 comprises a plurality of pixel areas 3 aligned in array, and the plurality of pixel areas 3 are separated by the black matrix 4, and the pixel area 3 comprises a sub pixel main area 21 and a sub pixel sub area 22, and two sides of the sub pixel sub area 22 are respectively provided with a first transparent electrode 41 and a second transparent electrode 42 electrically coupled thereto.

The sub pixel sub area 22 is made by electrochromic material, and by adjusting voltage signals applied to the two sides of the sub pixel sub area 22 with the first transparent electrode 41 and the second transparent electrode 42, color variation of the sub pixel sub area 22 is controlled to achieve switch of the color filter between high color saturation and high brightness display modes.

Specifically, the electrochromic material can be at least one of n-type metal oxide and cathodic decolorization conducting polymer; preferably, the cathodic decolorization conducting polymer is compound based on viologen group, compound based on phthalate, compound based on pyridine or compound based on anthraquinone.

The electrochromic material can be at least one of p-type metal oxide and anodic decolorization conducting polymer; preferably, the anodic decolorization conducting polymer is compound based on aniline, compound based on amino quinones, organic compound based on rare earth elements or compound based on dibenzo-p-dioxins.

The sub pixel sub area 22 can be made according to the property of the electrochromic material by proper method, such as vacuum sputter deposition, chemical polymerization or electrochemical polymerization.

Specifically, the material of the sub pixel main area 21 is a mixture of dye and photoresist, and the dye can be red, green, or blue dye to make the sub pixel main area 21 show red, green or blue.

The sub pixel main area 21 can be made by dye dispersion method, and the specific steps are: dispersing the dye in the photoresist to manufacture a photoresist mixture with color, and coating the photoresist mixture with color on the substrate 1, and then performing photolithography processes of exposure and development.

Preferably, the substrate 1 is a transparent glass substrate.

Specifically, according to the different properties of the electrochromic materials, the sub pixel sub area 22 can have two color variation modes by selecting the proper electrochromic material:

Specifically, the first color variation mode is: the sub pixel sub area 22 shows another specific color different from the sub pixel main area 21 in condition of not being applied with the voltage signal, and appears to be transparent and shows no color in condition of being applied with the voltage signal.

The second color variation mode is: the sub pixel sub area 22 appears to be transparent and shows no color in condition of not being applied with the voltage signal, and shows another specific color different from the sub pixel main area 21 in condition of being applied with the voltage signal. Similarly, it is capable of achieving the switch of the color filter of the present invention between high brightness and high color saturation display modes.

The present application mainly focuses detail description of the first color variation mode. When the sub pixel sub area 22 is set to be the first color variation mode, the switch of the color filter between high brightness and high color saturation display modes is below:

As shown in FIG. 2, as the first transparent electrode 41 and the second transparent electrode 42 do not apply voltage signal to the two sides of the sub pixel sub area 22, the sub pixel main areas 21 in the three sub pixel areas 3 sequentially aligned in the color filter respectively shows red (R), green (G) and blue (B). The sub pixel sub areas 22 in the three sub pixel areas 3 sequentially aligned respectively shows three other specific colors which are not red, green, blue. Then, the color filter is in the high color saturation display mode.

Figure 3:
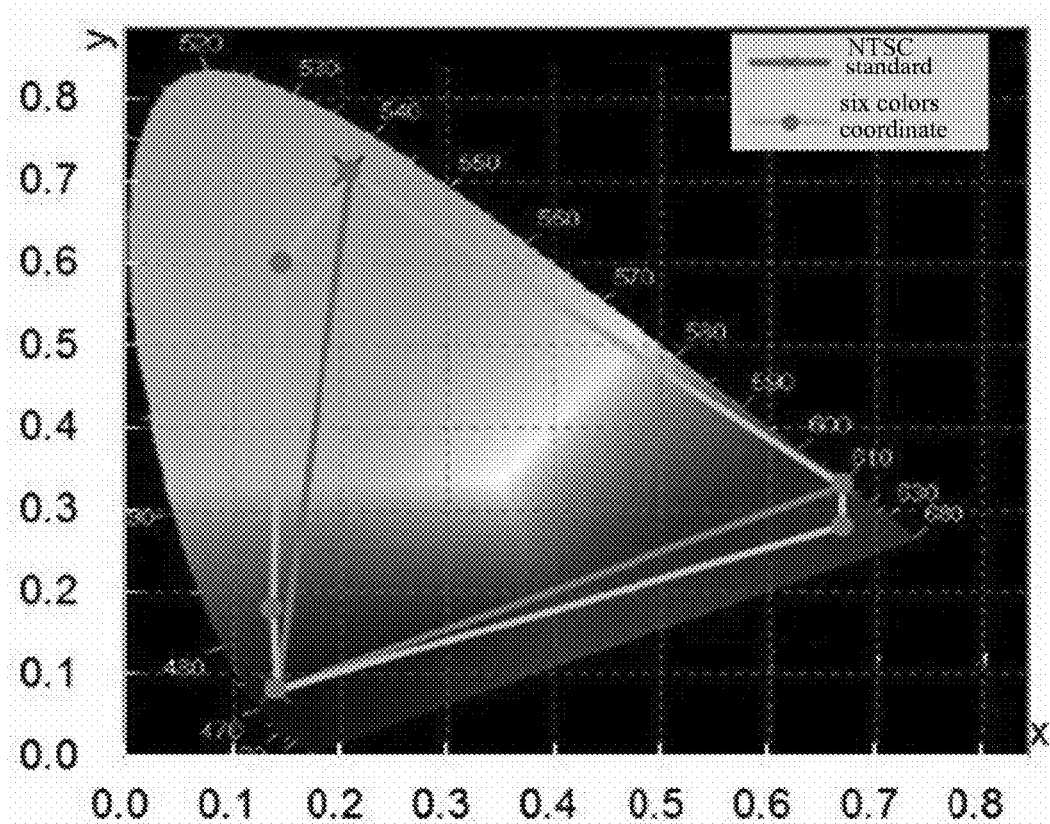
FIG. 3 is a color coordinate diagram of a color filter in high color saturation display mode according to the present invention.

As shown in FIG. 3, which is a color coordinate diagram of a color filter in high color saturation display mode according to the present invention, the "NTSC standard" represents the color filter merely having the red, green, blue, three kinds of color resist blocks according to prior art. The "six colors coordinate" represents the color filter of the present invention. As shown in FIG. 3, the color filter according to prior art merely has three colors coordinates, and the color filter of the present invention has six colors coordinates, which comprises three colors coordinates of the sub pixel main area 21 and the three colors coordinates of the sub pixel sub area 22. The three colors coordinates of the sub pixel sub area 22 are outside the color gamut surrounded by the three colors coordinates of the sub pixel main area 21. Thus, the color expression capability of the color filter is expanded to achieve the high color saturation display.

As shown in FIG. 4, after the first transparent electrode 41 and the second transparent electrode 42 apply voltage signal to the two sides of the sub pixel sub area 22, the sub pixel sub area 22 becomes transparent. Thus, the visible light transmission of the color filter is promoted to greatly raise the transmission of the entire substrate. Then, the color filter is in the high brightness display mode.

The electrochromic material utilized by the present invention can conveniently realize the reversible variation of the color and transparency of the material with the variation of the external voltage or current. The value of the voltage applied to the two end of the electrochromic material determines the color variation of the material, and the electrochromic material still can keep the colored state under circumstance that the power is cut off. Because the required driving voltage for the electrochromic material to realize the color variation is low and the response is quick, and thus the display requirement of the high color saturation and high brightness display can be satisfied.

Based on the aforesaid color filter, the present invention further provides a liquid crystal panel, comprising the aforesaid color filter. With the switch of the color filter between high color saturation and high brightness display modes, the display requirement of the high color saturation and high brightness display can be satisfied at the same time.

In conclusion, the present invention provides a color filter, comprising a substrate, and a color resist layer and a black matrix positioned on the substrate, and the color resist layer comprises a plurality of pixel areas aligned in array, and the plurality of pixel areas are separated by the black matrix, and the pixel area comprises a sub pixel main area and a sub pixel sub area, and two sides of the sub pixel sub area are respectively provided with a first transparent electrode and a second transparent electrode. The sub pixel sub area is made by electrochromic material, and by adjusting voltage signals applied to the two sides of the sub pixel sub area with the first transparent electrode and the second transparent electrode, the color variation of the sub pixel sub area is controlled to change the visible light transmission and the color expression of the sub pixel sub area to achieve switch of the color filter between high color saturation and high brightness display modes. Except satisfying the requirement of display requirement of high color saturation and high brightness at the same time, the color filter of the present invention further possesses advantages of high contrast, wide view angle and rich colors. The liquid crystal panel of the present invention is provided with the color filter capable of achieving switch of the color filter between high color saturation and high brightness display modes to satisfy the display requirement of high color saturation and high brightness at the same time.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A color filter, comprising a substrate, and a color resist layer and a black matrix positioned on the substrate, and the color resist layer comprises a plurality of pixel areas aligned in array, and the plurality of pixel areas are separated by the black matrix, and the pixel area comprises a sub pixel main area and a sub pixel sub area, and two sides of the sub pixel sub area are respectively provided with a first transparent electrode and a second transparent electrode electrically coupled thereto;

the sub pixel sub area is made by electrochromic material, and by adjusting voltage signals applied to the two sides of the sub pixel sub area with the first transparent electrode and the second transparent electrode, color variation of the sub pixel sub area is controlled to achieve switch of the color filter between high color saturation and high brightness display modes.

2. The color filter according to claim 1, wherein the electrochromic material is at least one of n-type metal oxide and cathodic decolorization conducting polymer.

3. The color filter according to claim 2, wherein the cathodic decolorization conducting polymer is compound based on viologen group, compound based on phthalate, compound based on pyridine or compound based on anthraquinone.

4. The color filter according to claim 1, wherein the electrochromic material is at least one of p-type metal oxide and anodic decolorization conducting polymer.

5. The color filter according to claim 4, wherein the anodic decolorization conducting polymer is compound based on aniline, compound based on amino quinones, organic compound based on rare earth elements or compound based on dibenzo-p-dioxins.

6. The color filter according to claim 1, wherein the sub pixel sub area is made by vacuum sputter deposition, chemical polymerization or electrochemical polymerization.

7. The color filter according to claim 1, wherein material of the sub pixel main area is a mixture of dye and photoresist; a manufacture method of the sub pixel main area is: dispersing the dye in the photoresist to manufacture a photoresist mixture with color, and coating the photoresist mixture with color on the substrate, and then performing photolithography processes of exposure and development.

8. The color filter according to claim 1, wherein the sub pixel sub area shows another specific color different from the sub pixel main area in condition of not being applied with the voltage signal, and appears to be transparent and shows no color in condition of being applied with the voltage signal.

9. The color filter according to claim 1, wherein the sub pixel sub area appears to be transparent and shows no color in condition of not being applied with the voltage signal, and shows another specific color different from the sub pixel main area in condition of being applied with the voltage signal.

10. A liquid crystal panel, comprising the color filter according to claim 1.

11. A color filter, comprising a substrate, and a color resist layer and a black matrix positioned on the substrate, and the color resist layer comprises a plurality of pixel areas aligned in array, and the plurality of pixel areas are separated by the black matrix, and the pixel area comprises a sub pixel main area and a sub pixel sub area, and two sides of the sub pixel sub area are respectively provided with a first transparent electrode and a second transparent electrode electrically coupled thereto;

the sub pixel sub area is made by electrochromic material, and by adjusting voltage signals applied to the two sides of the sub pixel sub area with the first transparent electrode and the second transparent electrode, color variation of the sub pixel sub area is controlled to achieve switch of the color filter between high color saturation and high brightness display modes;

wherein the sub pixel sub area is made by vacuum sputter deposition, chemical polymerization or electrochemical polymerization;

wherein material of the sub pixel main area is a mixture of dye and photoresist; a manufacture method of the sub pixel main area is: dispersing the dye in the photoresist to manufacture a photoresist mixture with color, and coating the photoresist mixture with color on the substrate, and then performing photolithography processes of exposure and development;

wherein the sub pixel sub area shows another specific color different from the sub pixel main area in condition of not being applied with the voltage signal, and appears to be transparent and shows no color in condition of being applied with the voltage signal.

12. The color filter according to claim 11, wherein the electrochromic material is at least one of n-type metal oxide and cathodic decolorization conducting polymer.

13. The color filter according to claim 12, wherein the cathodic decolorization conducting polymer is compound based on viologen group, compound based on phthalate, compound based on pyridine or compound based on anthraquinone.

14. The color filter according to claim 11, wherein the electrochromic material is at least one of p-type metal oxide and anodic decolorization conducting polymer.

15. The color filter according to claim 14, wherein the anodic decolorization conducting polymer is compound based on aniline, compound based on amino quinones, organic compound based on rare earth elements or compound based on dibenzo-p-dioxins.

* * * * *